US012642066B2

(12) United States Patent
Li et al.

(10) Patent No.: US 12,642,066 B2
(45) Date of Patent: May 26, 2026

(54) METHOD OF BACK END OF LINE METAL VIA PROCESS

(71) Applicant: Shanghai Huali Integrated Circuit Corporation, Shanghai (CN)

(72) Inventors: Qiaodan Li, Shanghai (CN); Dong Zhao, Shanghai (CN); Pengfei Wang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 388 days.

(21) Appl. No.: 18/422,120

(22) Filed: Jan. 25, 2024

(65) Prior Publication Data

US 2024/0258165 A1 Aug. 1, 2024

(30) Foreign Application Priority Data

Feb. 1, 2023 (CN) .......................... 202310095998.7

(51) Int. Cl.
*H10W 20/00* (2026.01)
*H10W 20/41* (2026.01)
*H10W 20/42* (2026.01)

(52) U.S. Cl.
CPC ....... *H10W 20/035* (2026.01); *H10W 20/043* (2026.01); *H10W 20/056* (2026.01); *H10W 20/081* (2026.01); *H10W 20/42* (2026.01); *H10W 20/425* (2026.01)

(58) Field of Classification Search
CPC ............. H10W 20/035; H10W 20/043; H10W 20/056; H10W 20/081; H10W 20/42; H10W 20/425
See application file for complete search history.

(56) References Cited

U.S. PATENT DOCUMENTS

| | | | |
|---|---|---|---|
| 2019/0139821 A1* | 5/2019 | Yang ................... | H10W 20/084 |
| 2019/0164885 A1* | 5/2019 | Yang ..................... | H10W 20/42 |
| 2020/0126854 A1* | 4/2020 | Motoyama .......... | H10W 20/034 |
| 2020/0294911 A1* | 9/2020 | Amanapu .......... | H10W 20/033 |
| 2022/0246534 A1* | 8/2022 | Chin ................... | H10W 20/425 |

* cited by examiner

*Primary Examiner* — Jeff W Natalini
*Assistant Examiner* — Rose Keagy
(74) *Attorney, Agent, or Firm* — Banner & Witcoff, Ltd.

(57) ABSTRACT

The present application form a via and a trench longitudinally communicating with the via; forming a TiN barrier layer on an inner surface of the trench and on an inner surface of the via; forming a Co seed layer on a surface of the TiN barrier layer; fully filling the via with Co by means of electrochemical deposition; forming a TiN hard mask layer over the Co on the bottom of the trench; removing the Co seed layer on sidewalls of the trench; removing the TiN hard mask layer on the bottom of the trench; covering the sidewalls and bottom of the trench with a TaN/Ta barrier layer; covering the TaN/Ta barrier layer with a liner layer; growing a Cu seed layer over the liner layer in the trench; and filling the trench with Cu by means of electrochemical deposition, and performing top planarization.

14 Claims, 6 Drawing Sheets

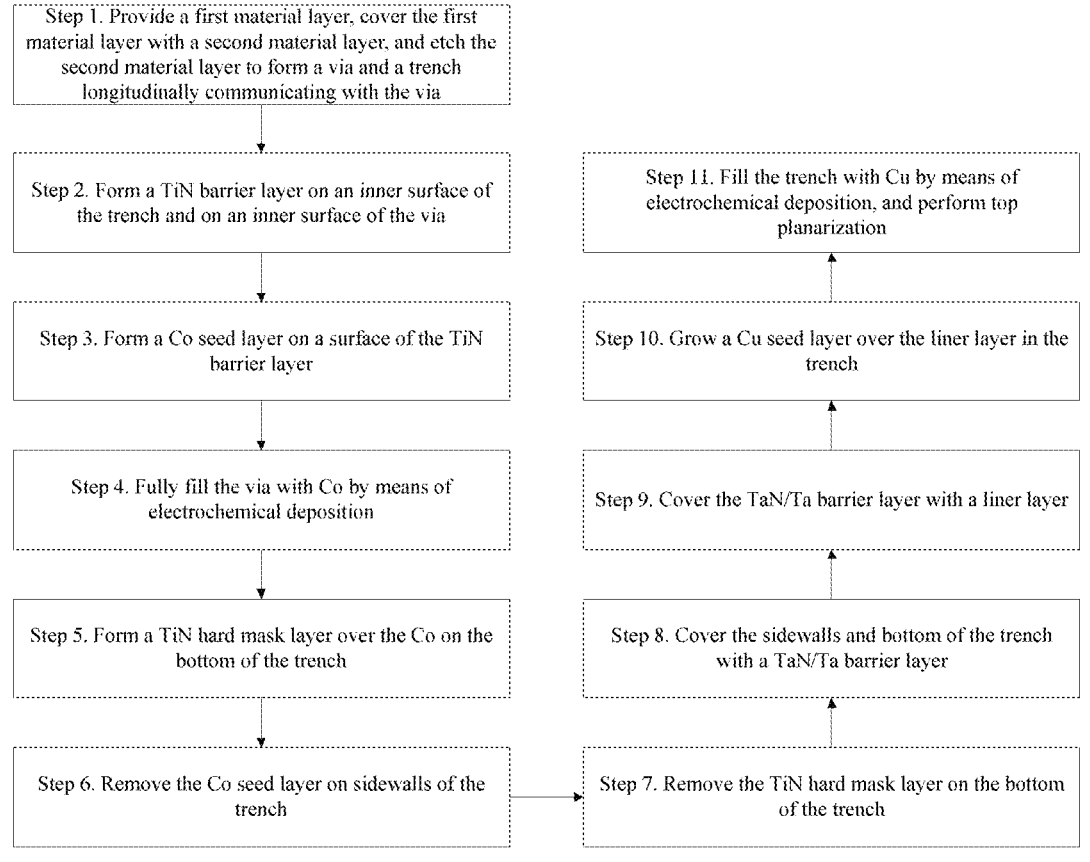

Step 1. Provide a first material layer, cover the first material layer with a second material layer, and etch the second material layer to form a via and a trench longitudinally communicating with the via Step 2. Form a TiN barrier layer on an inner surface of the trench and on an inner surface of the via Step 3. Form a Co seed layer on a surface of the TiN barrier layer Step 4. Fully fill the via with Co by means of electrochemical deposition Step 5. Form a TiN hard mask layer over the Co on the bottom of the trench Step 6. Remove the Co seed layer on sidewalls of the trench Step 11. Fill the trench with Cu by means of electrochemical deposition, and perform top planarization Step 10. Grow a Cu seed layer over the liner layer in the trench Step 9. Cover the TaN/Ta barrier layer with a liner layer Step 8. Cover the sidewalls and bottom of the trench with a TaN/Ta barrier layer Step 7. Remove the TiN hard mask layer on the bottom of the trench

FIG. 12

| | Length (Å) | Bulk resistivity (uΩ·cm) | Bulk resistivity proportion (%) | Resistivity taking into account the surface scattering effect (uΩ·cm) | Resistivity proportion taking into account the surface scattering effect (%) |
|---|---|---|---|---|---|
| Cu | 450 | 1.67 | 20.56% | 2.34 | 26.61% |
| Co | 28 | 6.64 | 5.09% | 6.68 | 4.73% |
| Ta | 5 | 183.10 | 25.05% | 183.1 | 23.13% |
| TaN | 10 | 218.10 | 59.67% | 218.1 | 55.11% |
| Total | 493 | 7.41 | | 8.02 | |

FIG. 13

| | Length (Å) | Bulk resistivity (uΩ·cm) | Bulk resistivity proportion (%) | Resistivity taking into account the surface scattering effect (uΩ·cm) | Resistivity proportion taking into account the surface scattering effect (%) |
|---|---|---|---|---|---|
| Co | 473 | 6.64 | 87.86% | 6.68 | 87.92% |
| TiN | 20 | 21.7 | 12.14% | 21.7 | 12.08% |
| Total | 493 | 7.25 | | 7.29 | |

FIG. 14

METHOD OF BACK END OF LINE METAL VIA PROCESS

CROSS-REFERENCE TO RELATED APPLICATIONS

This application claims priority to Chinese patent application No. 202310095998.7 filed on Feb. 1, 2023, the disclosure of which is incorporated herein by reference in entirety.

TECHNICAL FIELD

The present application relates to the technical field of semiconductors, in particular to a method of a back end of line metal via process.

BACKGROUND

The current back end of line (BEOL) copper interconnect process is copper damascene. The specific process includes forming a via and a trench by means of one-time etching, then sequentially depositing TaN/Ta barrier layer, a liner layer, and a Cu seed layer, and finally completing filling with ECP Cu.

BEOL metal interconnects consist of three parts: the barrier layer, the liner layer, and the metal, which are required to be considered as a whole during calculation of the resistivity of the metal interconnects. In this case, the barrier layer that functions to prevent metal atoms from diffusing into a low-K dielectric and the liner layer that has an adhesive function are thinned nearly to respective limits. As the thickness (the length of a metal wire) of a single lower layer of BEOL decreases exponentially, however, the thicknesses of the barrier layer and the liner layer cannot be thinned further, resulting in an exponential increase in the proportion of the resistivity of the barrier layer and the liner layer in the overall resistivity of the via.

Secondly, as the width of the metal interconnect decreases to near the metal electron mean free path, the impact of electrons on the conductivity is enhanced significantly due to surface and grain boundary scattering. Taking into account the surface scattering effect, the resistivity of a narrow metal wire consists of a combination of body resistivity and scattering resistivity (directly related to a product of the electron mean free path and the body resistivity). Although the body resistivity of copper is just 1.68 $\mu\Omega\cdot$cm, the electron mean free path of copper is 39 nm, which is much greater than that of cobalt, i.e., 4.82 nm. With the decrease of an opening CD, copper has significant resistivity size effect, and no longer has an absolute advantage over cobalt.

Furthermore, the Cu seed layer in the Cu interconnect can only be grown via PVD at a process temperature of less than 550° C. In order to ensure the continuity of the Cu seed layer, a thickness of 6 nm is required on each of two sidewalls, resulting in an ECP opening of a size that is much less than 10 nm as recommended in an ECP process after the deposition of the barrier layer/liner layer/seed layer, which is unfavorable to the yield.

When the opening CD of the via and the trench decreases to less than 22 nm and the thickness of a single layer decreases to less than 500 Angstroms, the Cu interconnect is no longer an optimal choice for interconnect metal in the via that is favorable to a reduction in an RC delay.

BRIEF SUMMARY

In view of the above defects in the prior art, the objective of the present application is to provide a method of a back end of line metal via process, so as to solve the problem in the prior art that a back end of line copper interconnect process causes an RC delay and is unfavorable to the yield.

In order to achieve the above objective and other related objectives, the present application provides a method of a back end of line metal via process, at least including:

step 1. providing a first material layer, covering the first material layer with a second material layer, and etching the second material layer to form a via and a trench longitudinally communicating with the via;

step 2. forming a TiN barrier layer on an inner surface of the trench and on an inner surface of the via;

step 3. forming a Co seed layer on a surface of the TiN barrier layer;

step 4. fully filling the via with Co by means of electrochemical deposition;

step 5. forming a TiN hard mask layer over the Co on the bottom of the trench;

step 6. removing the Co seed layer on sidewalls of the trench;

step 7. removing the TiN hard mask layer on the bottom of the trench;

step 8. covering the sidewalls and bottom of the trench with a TaN/Ta barrier layer;

step 9. covering the TaN/Ta barrier layer with a liner layer;

step 10. growing a Cu seed layer over the liner layer in the trench; and step 11. filling the trench with Cu by means of electrochemical deposition, and performing top planarization.

In an example, a depth of the via in step 1 is less than 500 Å.

In an example, a CD of the trench in step 1 is less than 22 nm.

In an example, the TiN barrier layer is formed in step 2 by means of atomic layer deposition or chemical vapor deposition.

In an example, the Co seed layer is formed in step 3 by means of physical vapor deposition or chemical vapor deposition.

In an example, a thickness of the Co seed layer in step 3 is 20 Å to 60 Å.

In an example, the fully filling the via with the Co in step 4 reaches the bottom of the trench.

In an example, the TiN hard mask layer is formed over the Co on the bottom of the trench in step 5 by means of physical vapor deposition without re-sputtering, and a thickness of the TiN hard mask layer is 5 Å to 30 Å.

In an example, the Co seed layer on the sidewalls of the trench is removed in step 6 by means of wet etching or dry etching.

In an example, the TiN hard mask layer on the bottom of the trench is removed in step 7 by means of dry etching or re-sputtering.

In an example, a thickness of the TaN/Ta barrier layer in step 8 is 5 Å to 30 Å.

In an example, the sidewalls and bottom of the trench are covered with the TaN/Ta barrier layer in step 8 by means of atomic layer deposition or physical vapor deposition.

In an example, the liner layer in step 9 is Co, Ru, or Rh; and a thickness of the liner layer is 10 Å to 40 Å.

In an example, the Cu seed layer is grown in step 10 by means of physical vapor deposition, and a thickness of the Cu seed layer is 150 Å to 250 Å.

As stated above, the method of a back end of line metal via process of the present application has the following beneficial effects: according to the present application, the copper damascene is replaced with cobalt damascene at the back end of line lower layer via that has a small opening and a small thickness, so as to reduce an RC delay of interconnects, while lowering the difficulty in filling, reducing defects, and improving the yield.

BRIEF DESCRIPTION OF THE DRAWINGS

FIG. 12 illustrates a flow diagram of a method of a back end of line metal via process of the present application;

FIG. 13 illustrates a comparison diagram of respective resistivities of TaN, Ta, Co, and Cu at a via site in a copper damascene process according to the present application; and FIG. 14 illustrates a resistivity at a via site in a cobalt damascene process according to the present application.

DETAILED DESCRIPTION OF THE DISCLOSURE

The implementations of the present application are described below using specific embodiments, and those skilled in the art could readily understand other advantages and effects of the present application from the contents disclosed in the description. The present application can also be implemented or applied using other different specific implementations, and various details in the description can also be modified or changed based on different viewpoints and applications, without departing from the spirit of the present application.

Please refer to FIG. 1 to FIG. 14. It should be noted that the drawings provided in the embodiments are only used to illustrate the basic concept of the present application in a schematic way, so the drawings only show the components related to the present application rather than being drawn according to the numbers, shapes, and sizes of the components in actual implementations. The types, numbers, and proportions of various components in actual implementations can be changed randomly, and the layout of the components may be more complicated.

The present application provides a method of a back end of line metal via process, referring to FIG. 12, at least including the following steps.

Figure 1:
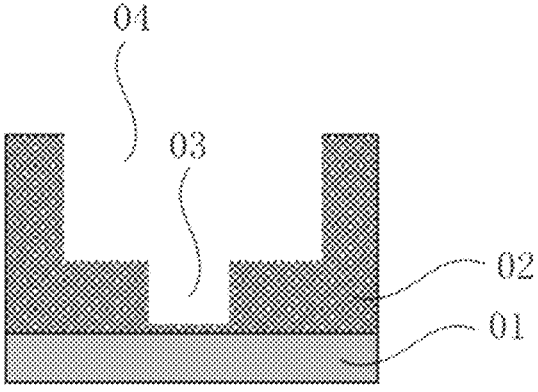
FIG. 1 to FIG. 11 illustrate schematic structural diagrams of various phases in a method of a back end of line metal via process of the present application.

Step 1. Provide a first material layer, cover the first material layer with a second material layer, and etch the second material layer to form a via and a trench longitudinally communicating with the via. Referring to FIG. 1, in step 1, the first material layer 01 is provided, the first material layer 01 is covered with the second material layer 02, and the second material layer 02 is etched to form a via 03 and a trench 04 longitudinally communicating with the via 03.

In this embodiment of the present application, a depth of the via 03 in step 1 is less than 500 Å.

In this embodiment of the present application, a CD of the trench 04 in step 1 is less than 22 nm.

Figure 2:
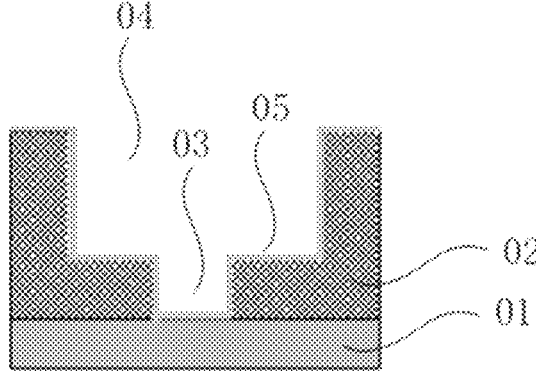

Step 2. Form a TiN barrier layer on an inner surface of the trench and on an inner surface of the via. Referring to FIG. 2, in step 2, the TiN barrier layer 05 is formed on the inner surface of the trench 04 and on the inner surface of the via 03.

In this embodiment of the present application, the TiN barrier layer 05 is formed in step 2 by means of atomic layer deposition (ALD) or chemical vapor deposition (CVD).

Figure 3:
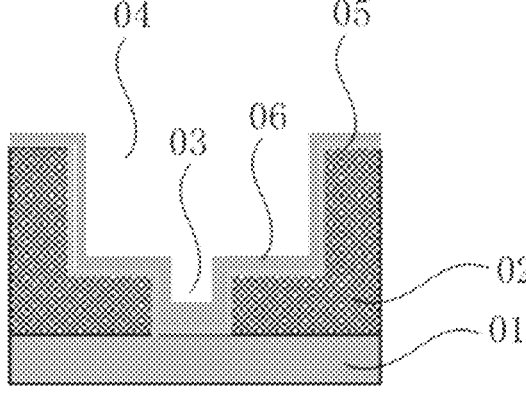

Step 3. Form a Co seed layer on a surface of the TiN barrier layer. Referring to FIG. 3, in step 3, the Co seed layer 06 is formed on the surface of the TiN barrier layer 05.

In this embodiment of the present application, the Co seed layer 06 is formed in step 3 by means of physical vapor deposition (PVD) or chemical vapor deposition (CVD).

In this embodiment of the present application, a thickness of the Co seed layer 06 in step 3 is 20 Å to 60 Å.

Figure 4:
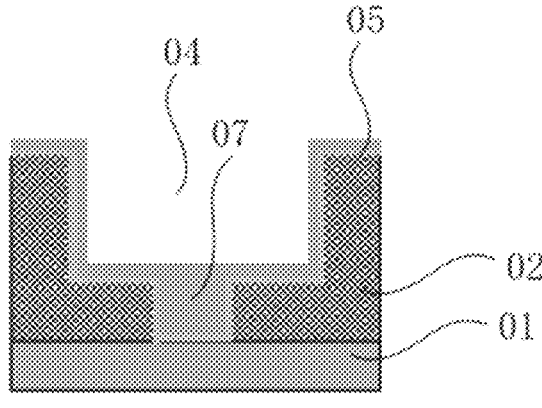

Step 4. Fully fill the via with Co by means of electrochemical deposition. Referring to FIG. 4, in step 4, the via 03 is fully filled with the Co (07) by means of electrochemical deposition (ECP).

In this embodiment of the present application, the fully filling the via with the Co (07) in step 4 reaches the bottom of the trench.

Figure 5:
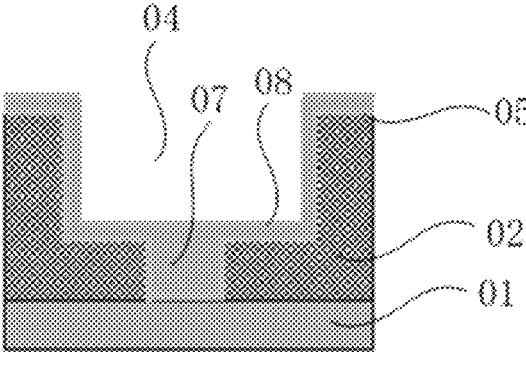

Step 5. Form a TiN hard mask layer over the Co on the bottom of the trench. Referring to FIG. 5, in step 5, the TiN hard mask layer 08 is formed over the Co (07) on the bottom of the trench 04.

In this embodiment of the present application, the TiN hard mask layer 08 is formed over the Co (07) on the bottom of the trench in step 5 by means of physical vapor deposition without re-sputtering, and a thickness of the TiN hard mask layer 08 is 5 Å to 30 Å.

Figure 6:
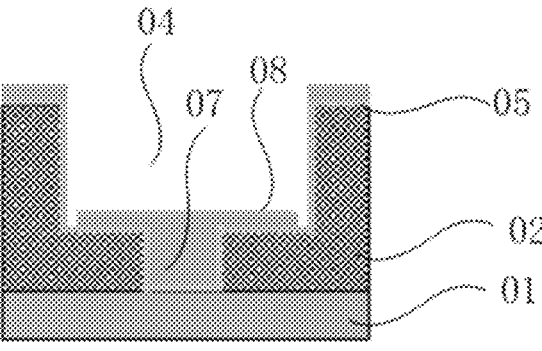

Step 6. Remove the Co seed layer on sidewalls of the trench. Referring to FIG. 6, in step 6, the Co seed layer 06 on the sidewalls of the trench 04 is removed.

In this embodiment of the present application, the Co seed layer 06 on the sidewalls of the trench 04 is removed in step 6 by means of wet etching or dry etching.

Figure 7:
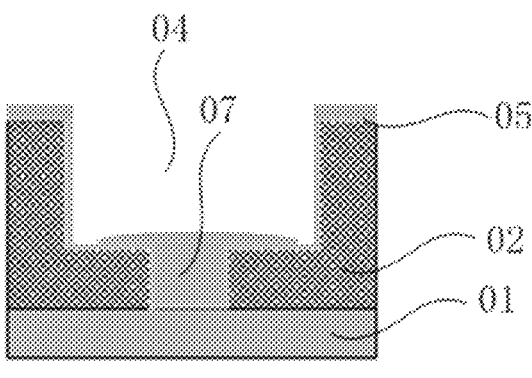

Step 7. Remove the TiN hard mask layer on the bottom of the trench. Referring to FIG. 7, in step 7, the TiN hard mask layer 08 on the bottom of the trench 04 is removed.

In this embodiment of the present application, the TiN hard mask layer 08 on the bottom of the trench 07 is removed in step 7 by means of dry etching or re-sputtering.

Figure 8:
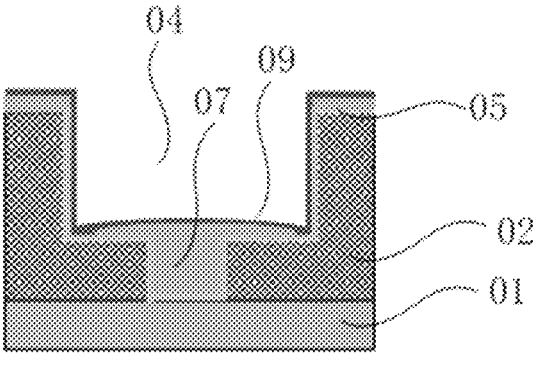

Step 8. Cover the sidewalls and bottom of the trench with a TaN/Ta barrier layer. Referring to FIG. 8, in step 8, the sidewalls and bottom of the trench 04 are covered with the TaN/Ta barrier layer 09.

In this embodiment of the present application, a thickness of the TaN/Ta barrier layer 09 in step 8 is 5 Å to 30 Å.

In this embodiment of the present application, the sidewalls and bottom of the trench 04 are covered with the TaN/Ta barrier layer 09 in step 8 by means of atomic layer deposition (ALD) or physical vapor deposition (PVD).

Step 9. Cover the TaN/Ta barrier layer with a liner layer.

In this embodiment of the present application, the liner layer in step 9 is Co, Ru, or Rh; and a thickness of the liner layer is 10 Å to 40 Å.

Figure 9:
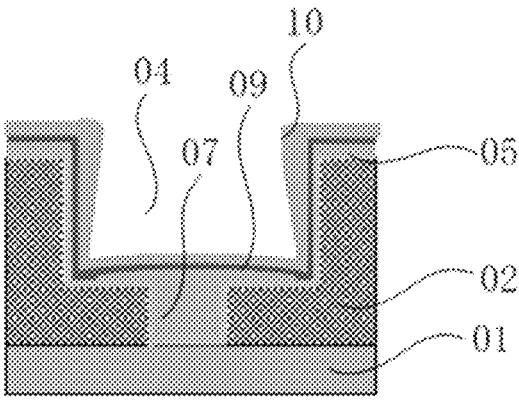

Step 10. Grow a Cu seed layer over the liner layer in the trench. Referring to FIG. 9, in step 10, the Cu seed layer 10 is grown over the liner layer in the trench. The liner layer is not shown in FIG. 8 or FIG. 9, and the liner layer refers to a thin dielectric layer.

In this embodiment of the present application, the Cu seed layer 10 is grown in step 10 by means of physical vapor deposition, and a thickness of the Cu seed layer 10 is 150 Å to 250 Å.

Figure 10:
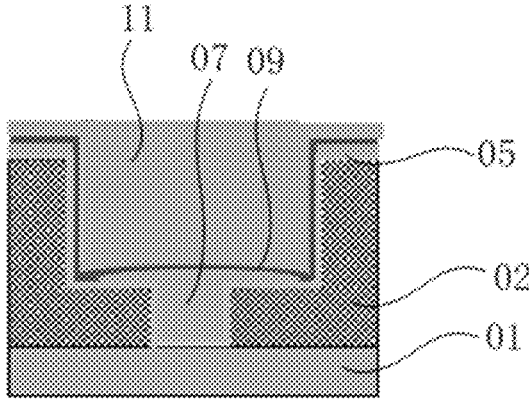
Figure 11:
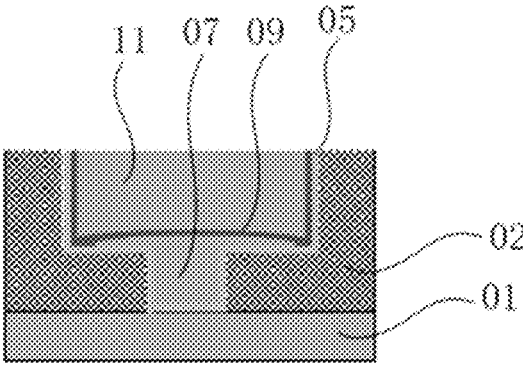

Step 11. Fill the trench with Cu by means of electrochemical deposition, and perform top planarization. Referring to FIG. 10, in step 11, the trench is filled with the Cu (11) by means of electrochemical deposition (ECP). Referring to FIG. 11, FIG. 11 illustrates a schematic structural diagram resulting from the top planarization following the filling with Cu.

The distribution of the TaN/Ta barrier layer, the Co liner layer, and Cu metal in the via of the back end of line (BEOL), and the respective resistivities of TaN, Ta, Co, and Cu are shown in FIG. 13. The overall resistivity may be approximated as a result of series connection of the four resistivities of TaN, Ta, Co, and Cu. As can be seem from the calculation of respective proportions in the overall resistivity based on respective actual thicknesses obtained from slices, in processes of 14 nm and below, the resistivity of the TaN/Ta barrier layer required to overcome the high Cu mobility accounts for 78.2%-84.7% of the overall resistivity, while the resistivity of Cu just accounts for 20.6%-26.6%. When the thickness of a via layer is thinned to less than 500 Å, TaN/Ta replaces Cu to serve as a dominant part for the overall resistivity in the via. The overall resistivity is about 7.41 uΩ·cm (taking into account only the bulk resistivity) and 8.03 uΩ·cm (taking into account the bulk resistivity and surface scattering effect).

On the other hand, using a cobalt damascene process to fill a via of the same size and using the same model for calculation, as shown in FIG. 14, the metal Co is still the dominant part for the overall resistivity in the via, in which case the overall resistivity is about 7.25 uΩ·cm (taking into account only the bulk resistivity) and 7.29 uΩ·cm (taking into account both the bulk resistivity and the surface scattering effect), which is less than the overall resistivity of the copper damascene process.

To sum up, according to the present application, the copper damascene is replaced with cobalt damascene at the back end of line lower layer via that has a small opening and a small thickness, so as to reduce an RC delay of interconnects, while lowering the difficulty in filling, reducing defects, and improving the yield. Therefore, the present application effectively overcomes various defects in the prior art and thus has high industrial utilization.

The above embodiments merely illustrate the principle and effect of the present application, rather than for limiting the present application. Any person skilled in the art can modify or change the above embodiments without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method of a back end of line metal via process, at least comprising:

step 1: providing a first material layer, covering the first material layer with a second material layer, and etching the second material layer to form a via and a trench longitudinally communicating with the via;

step 2: forming a TiN barrier layer on an inner surface of the trench and on an inner surface of the via;

step 3: forming a Co seed layer on a surface of the TiN barrier layer;

step 4: fully filling the via with Co by means of electro-chemical deposition;

step 5: forming a TiN hard mask layer over the Co on the bottom of the trench;

step 6: removing the Co seed layer on sidewalls of the trench;

step 7: removing the TiN hard mask layer on the bottom of the trench;

step 8: covering the sidewalls and bottom of the trench with a TaN/Ta barrier layer;

step 9: covering the TaN/Ta barrier layer with a liner layer;

step 10: growing a Cu seed layer over the liner layer in the trench; and step 11: filling the trench with Cu by means of electro-chemical deposition, and performing top planarization.

2. The method of the back end of line metal via process according to claim 1, wherein a depth of the via in step 1 is less than 500 Å.

3. The method of the back end of line metal via process according to claim 1, wherein a CD of the trench in step 1 is less than 22 nm.

4. The method of the back end of line metal via process according to claim 1, wherein the TiN barrier layer is formed in step 2 by means of atomic layer deposition or chemical vapor deposition.

5. The method of the back end of line metal via process according to claim 1, wherein the Co seed layer is formed in step 3 by means of physical vapor deposition or chemical vapor deposition.

6. The method of the back end of line metal via process according to claim 1, wherein a thickness of the Co seed layer in step 3 is 20 Å to 60 Å.

7. The method of the back end of line metal via process according to claim 1, wherein the fully filling the via with the Co in step 4 reaches the bottom of the trench.

8. The method of the back end of line metal via process according to claim 1, wherein the TiN hard mask layer is formed over the Co on the bottom of the trench in step 5 by means of physical vapor deposition without re-sputtering, and a thickness of the TiN hard mask layer is 5 Å to 30 Å.

9. The method of the back end of line metal via process according to claim 1, wherein the Co seed layer on the sidewalls of the trench is removed in step 6 by means of wet etching or dry etching.

10. The method of the back end of line metal via process according to claim 1, wherein the TiN hard mask layer on the bottom of the trench is removed in step 7 by means of dry etching or re-sputtering.

11. The method of the back end of line metal via process according to claim 1, wherein a thickness of the TaN/Ta barrier layer in step 8 is 5 Å to 30 Å.

12. The method of the back end of line metal via process according to claim 1, wherein the sidewalls and bottom of the trench are covered with the TaN/Ta barrier layer in step 8 by means of atomic layer deposition or physical vapor deposition.

13. The method of the back end of line metal via process according to claim 1, wherein the liner layer in step 9 is Co, Ru, or Rh; and a thickness of the liner layer is 10 Å to 40 Å.

14. The method of the back end of line metal via process according to claim 1, wherein the Cu seed layer is grown in step 10 by means of physical vapor deposition, and a thickness of the Cu seed layer is 150 Å to 250 Å.

* * * * *